United States Patent
Sankavaram et al.

(10) Patent No.: US 12,210,067 B2
(45) Date of Patent: *Jan. 28, 2025

(54) RESISTANCE ESTIMATION OF HIGH VOLTAGE BATTERY PACKS DURING VEHICLE DRIVING OPERATION

(71) Applicant: GM GLOBAL TECHNOLOGY OPERATIONS LLC, Detroit, MI (US)

(72) Inventors: Chaitanya Sankavaram, Rochester Hills, MI (US); Calvin Wang, Union City, CA (US); Ciro A. Spigno, Leonard, MI (US); Garrett Michael Seeman, Troy, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 479 days.

This patent is subject to a terminal disclaimer.

(21) Appl. No.: 17/516,223

(22) Filed: Nov. 1, 2021

(65) Prior Publication Data
US 2023/0133482 A1   May 4, 2023

(51) Int. Cl.
*G01R 31/392*   (2019.01)
*B60L 58/10*   (2019.01)
*G01R 31/3842*   (2019.01)
*G01R 31/389*   (2019.01)

(52) U.S. Cl.
CPC .......... *G01R 31/392* (2019.01); *B60L 58/10* (2019.02); *G01R 31/3842* (2019.01); *G01R 31/389* (2019.01)

(58) Field of Classification Search
CPC ......... B60L 2240/545; B60L 2240/547; B60L 2240/549; B60L 3/0046; B60L 3/12; B60L 58/10; B60L 58/12; B60L 58/16; G01R 31/3842; G01R 31/389; G01R 31/392; G01R 31/396
USPC .......................................................... 702/63
See application file for complete search history.

(56) References Cited

U.S. PATENT DOCUMENTS

| | | | |
|---|---|---|---|
| 2010/0198536 A1* | 8/2010 | Hess ................... | G01R 31/392 |
| | | | 702/63 |
| 2013/0200902 A1 | 8/2013 | Kurimoto | |
| 2013/0325379 A1 | 12/2013 | Nakamura | |
| 2017/0201103 A1 | 7/2017 | Jeon et al. | |

(Continued)

OTHER PUBLICATIONS

U.S. Appl. No. 17/516,279, filed Nov. 1, 2021, Sankavaram et al.

*Primary Examiner* — Yoshihisa Ishizuka
*Assistant Examiner* — Joshua L Forristall

(57) ABSTRACT

A system for monitoring a battery of a vehicle includes a current measuring circuit to measure a current of the battery comprising a plurality of cell groups connected to each other. A voltage measuring circuit is to measure voltages of the cell groups. A controller is configured to define a plurality operating regions in a current profile of the battery during a drive cycle of the vehicle. The controller is configured to filter the current and the voltages measured in the operating regions and calculate internal resistances of the cell groups in the operating regions based on the filtered current and voltages. The controller is configured to generate statistical values based on the internal resistances of the cell groups and determine whether one or more of the cell groups is faulty based on differences between maximum and minimum values of one of the statistical values across the cell groups.

14 Claims, 10 Drawing Sheets

(56) References Cited

U.S. PATENT DOCUMENTS

| | | | |
|---|---|---|---|
| 2021/0190871 A1* | 6/2021 | Sugino | G01R 31/389 |
| 2022/0024438 A1* | 1/2022 | Vuylsteke | B60W 10/06 |
| 2022/0099745 A1* | 3/2022 | Kroener | B60L 58/16 |

* cited by examiner

RESISTANCE ESTIMATION OF HIGH VOLTAGE BATTERY PACKS DURING VEHICLE DRIVING OPERATION

CROSS-REFERENCE TO RELATED APPLICATIONS

This application is related to U.S. patent application Ser. No. 17/516,279 filed on Nov. 1, 2021 and entitled "HEALTH MONITORING METHODS FOR EARLY FAULT DETECTION IN HIGH VOLTAGE BATTERY PACKS USED IN ELECTRIC VEHICLES." The entire disclosure of the application referenced above is incorporated herein by reference.

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

The present disclosure relates generally to electric vehicles and more particularly to resistance estimation of high voltage battery packs during vehicle driving operation.

Use of electric vehicles is proliferating. The electric vehicles are powered by batteries. Performance of the batteries tends to degrade over time. The batteries may also develop problems during use. For example, one or more cells in a battery pack may develop problems and/or degrade faster than other cells in the battery pack. An internal resistance of a battery changes as the battery ages. For example, the internal resistance increases due to changes in temperature, state of charge, and current drawn from the battery. The internal resistance also changes if one or more cells in a battery pack develop problems. The changes in the internal resistance of the battery can indicate degradation of battery performance over time and can be used to detect problems that may develop in the battery during use.

SUMMARY

A system for monitoring a battery of a vehicle comprises a current measuring circuit, a voltage measuring circuit, and a controller. The current measuring circuit is configured to measure a current of the battery comprising a plurality of cell groups connected to each other. The voltage measuring circuit is configured to measure voltages of the cell groups. The controller is in communication with current and voltage measuring circuits. The controller is configured to define a plurality operating regions in a current profile of the battery during a drive cycle of the vehicle. The controller is configured to filter the current and the voltages measured in the operating regions. The controller is configured to calculate internal resistances of the cell groups in the operating regions based on the filtered current and voltages. The controller is configured to generate statistical values based on the internal resistances of the cell groups. The controller is configured to determine whether one or more of the cell groups is faulty based on differences between maximum and minimum values of one or more of the statistical values across the cell groups.

In another feature, the controller is configured to determine whether the one or more of the cell groups is faulty based on a highest value of the differences.

In another feature, the controller is configured to select internal resistance data of the cell groups from one of the operating regions corresponding to a highest value of the differences and further configured to at least one of: store the selected internal resistance data in memory of the controller for diagnosing the one or more of the cell groups; send the selected internal resistance data to a remote server for prognostics and determining a trend in a health of the battery; and provide a message regarding the health of the battery based on the selected internal resistance data.

In another feature, the controller is configured to define one of the operating regions when the current is stable for a predetermined time period in the one of the operating regions.

In another feature, the controller is configured to define the operating regions based on the current, temperature, and state of charge of the battery.

In another feature, the controller is configured to determine whether the one or more of the cell groups is faulty regardless of changes in temperature and state of charge of the battery.

In another feature, the controller is configured to define the operating regions based on predetermined ranges of the current, temperature, and state of charge of the battery.

In another feature, the controller is configured to: define a plurality of bands within one of the operating regions based on a predetermined range and a plurality of predetermined ranges of temperature and state of charge of the battery; calculate the internal resistances of the cell groups in the bands based on the filtered current and the voltages; generate individual statistical values for the bands based on the internal resistances of the cell groups in the bands; determine differences between maximum and minimum values of one or more of the individual statistical values; select internal resistance data of the cell groups from one of the bands corresponding to a highest value of the differences; and diagnose a health of the battery based on the selected internal resistance data.

In another feature, the controller is configured to determine whether the one or more of the cell groups is faulty based on the highest value of the differences.

In another feature, the controller is configured to at least one of: store the selected internal resistance data in memory of the controller for diagnosing the one or more cell groups; send the selected internal resistance data to a remote server for prognostics and determining a trend in the health of the battery; and provide a message regarding the health of the battery based on the selected internal resistance data.

In still other features, a method for monitoring a battery of a vehicle comprises measuring a current of the battery comprising a plurality of cell groups connected to each other and voltages of the cell groups. The method comprises defining a plurality operating regions in a current profile of the battery during a drive cycle of the vehicle. The method comprises filtering the current and the voltages measured in the operating regions, and calculating internal resistances of the cell groups in the operating regions based on the filtered current and voltages. The method comprises generating statistical values based on the internal resistances of the cell groups, and determining whether one or more of the cell groups is faulty based on differences between maximum and minimum values of one or more of the statistical values across the cell groups.

In another feature, the method further comprises determining whether the one or more of the cell groups is faulty based on a highest value of the differences.

In other features, the method further comprises selecting internal resistance data of the cell groups from one of the operating regions corresponding to a highest value of the differences; and at least one of storing the selected internal resistance data in memory of a controller coupled to the battery for diagnosing the one or more of the cell groups; sending the selected internal resistance data to a remote server for prognostics and determining a trend in a health of the battery; and providing a message regarding the health of the battery based on the selected internal resistance data.

In another feature, the method further comprises defining one of the operating regions when the current is stable for a predetermined time period in the one of the operating regions.

In another feature, the method further comprises defining the operating regions based on the current, temperature, and state of charge of the battery.

In another feature, the method further comprises determining whether the one or more of the cell groups is faulty regardless of changes in temperature and state of charge of the battery.

In another feature, the method further comprises defining the operating regions based on predetermined ranges of the current, temperature, and state of charge of the battery.

In other features, the method further comprises defining a plurality of bands within one of the operating regions based on a predetermined range and a plurality of predetermined ranges of temperature and state of charge of the battery; calculating the internal resistances of the cell groups in the bands based on the filtered current and the voltages; generating individual statistical values for the bands based on the internal resistances of the cell groups in the bands; determining differences between maximum and minimum values of one or more of the individual statistical values; selecting internal resistance data of the cell groups from one of the bands corresponding to a highest value of the differences; and diagnosing a health of the battery based on the selected internal resistance data.

In another feature, the method further comprises determining whether the one or more of the cell groups is faulty based on the highest value of the differences.

In other features, the method further comprises at least one of: storing the selected internal resistance data in memory of a controller coupled to the battery for diagnosing the one or more cell groups; sending the selected internal resistance data to a remote server for prognostics and determining a trend in the health of the battery; and providing a message regarding the health of the battery based on the selected internal resistance data.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
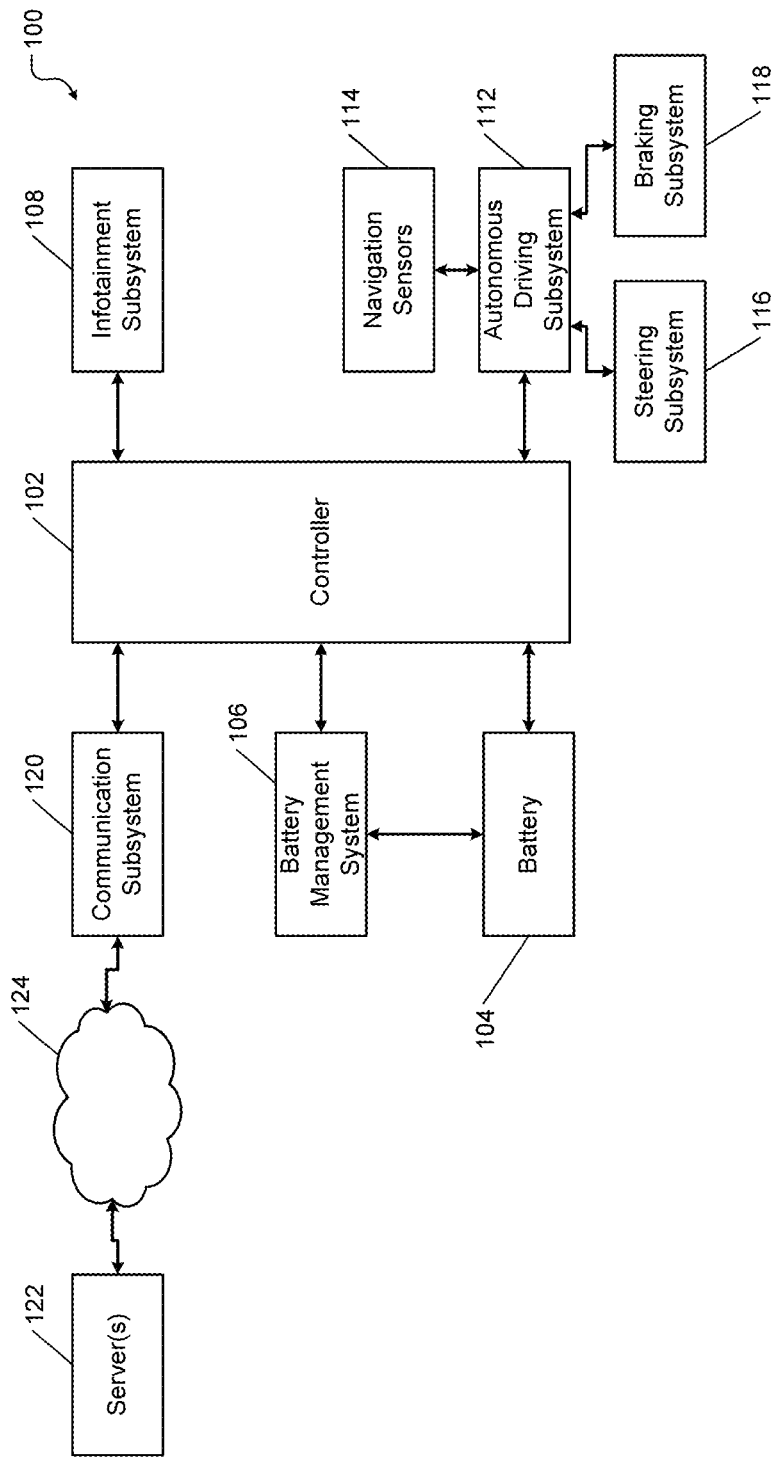
FIG. 1 shows an example of a control system of an electric vehicle.

The present disclosure provides a system and a method to estimate an internal resistance of a battery of an electric vehicle and to monitor battery performance at individual cell level to detect failures due to high internal resistance. The method is performed while the electric vehicle is being driven. The present disclosure provides a robust internal resistance estimator implemented in a controller while considering different noise and other environmental factors. The estimator is designed to optimize the memory of the controller. The estimator provides health indicators that allow detecting abnormalities in cells and identifying abnormal cells in the battery at an early stage.

Specifically, the estimator provides a health indicator that is monitored to characterize the internal resistance of the battery to quantify degradation in battery performance. The estimator provides an ability to detect abnormal behavior at each individual cell group level and to isolate failures to specific cell groups. The estimator is implemented in an onboard controller to estimate the internal resistances of individual cell groups, which is referred to as the health indicator. Various pack level features and cell group level features are computed based on the estimated internal resistances of individual cell groups. The features can be used for diagnosing faulty cell groups in the battery. Additionally, the features can be transmitted to a server in a cloud for monitoring trends and for performing prognostics and service/diagnostics.

More specifically, the system and the method for estimating the internal resistances of the individual cell groups of the battery and monitoring the overall health of the battery pack utilize multiple narrower operating regions of the battery's current profile during a drive cycle of the electric vehicle. The multiple narrower operating regions of the battery are used to estimate the internal resistance of the battery and to minimize the impact of battery conditions (e.g., temperature, state of charge (SOC), and current) of the battery on the internal resistance estimation. The system estimates the internal resistance of the battery in each of the operating regions and tracks statistical features such as minimum, maximum, average and other values of the internal resistance for each individual operating region. The system uses a low pass filter to filter the current of the battery pack and to filter cell voltages. The system uses stability criteria (explained below) for the filtered current as a threshold condition to compute the internal resistance of each cell group.

The system performs the internal resistance estimations based on a DC-equivalent circuit model for each cell group, which is expressed as $R=[V-OCV]/I$, where V and I are filtered cell group voltages and filtered battery pack current, respectively; and OCV is the open circuit voltage of the battery pack. By using a pack level resistance difference as a feature, the system selects optimal internal resistance data for tracking the internal resistances of the cell groups in the multiple operating regions. The system provides the ability to compute the internal resistance of the battery in multiple narrow operating regions and stores only the optimal data in the memory of the controller that indicates the maximum resistance spread across different cell groups within the battery pack. Storing only the optimal data optimizes the memory requirement and memory usage in the controller.

The system uses the optimal data selected based on the resistance statistics to detect abnormal behavior at each individual cell group level and to isolate failures to specific cell groups/modules within a battery pack. The system monitors failure progression in the cells and sends proactive alerts/notifications to warn customers ahead of a failure and to avoid vehicle stalls. The system manages the vehicle operation when faults are detected. The calculated features can be transmitted to a server in a cloud for monitoring trends in the health of the battery and for performing prognostics and to aid service/diagnostics of the battery. Final health indicator data (historical statistics) observed from each vehicle provides diagnostic data for service technicians to assess the battery health. The system resides in an onboard controller in the vehicle to estimate the internal resistance (i.e., the health indicator) for individual cell groups. The system provides a passive approach for the internal resistance estimation while the electric vehicle is being driven, which does not impact driving the electric vehicle. These and other features of the present disclosure are described below in detail.

The present disclosure is organized as follows. Initially, a block diagram of a control system of an electric vehicle is shown and described with reference to FIG. 1. Examples of cell groups of a battery of the electric vehicle are shown and described with reference to FIGS. 2A and 2B. Examples of factors affecting the internal resistances of the battery are shown and described with reference to FIGS. 3A-3C. An example of a current profile of the battery during a drive cycle of the electric vehicle and examples of operating regions defined in the current profile are shown and described with reference to FIG. 4. An example of a health monitoring system for the battery is shown and described with reference to FIG. 5. An overall method used by the health monitoring system of FIG. 5 to monitor and assess the health of the battery is shown and described with reference to FIG. 6. Subsequently, the steps of the method of FIG. 6 are shown and described in further detail with reference to FIGS. 7-8. The spreads in the internal resistances of the cell groups are shown and described with reference to FIGS. 10A and 10B.

FIG. 1 shows an example of a control system 100 of an electric vehicle. The control system 100 comprises a controller 102, a battery 104, a battery management system (BMS) 106, an infotainment subsystem 108, and an autonomous driving subsystem (implementing SAE Levels 1-5) 112. The controller 102 communicates with the battery 104 and implements a health monitoring system shown and described below in detail with reference to FIG. 5. The controller 102 communicates with the various subsystems of the vehicle. The battery 104 supplies power to the various subsystems of the electric vehicle. The BMS 106 performs battery management operations, which include monitoring the battery 104 and supplying power from the battery 104 to the various subsystems of the vehicle. The health monitoring system can also be implemented in the BMS 106.

The infotainment subsystem 108 may include audiovisual multimedia subsystems and a human to machine interface (HMI) that allows occupants of the electric vehicle to interact with the control system 100. The infotainment subsystem 108 also provides alerts provided by the health monitoring system to the occupants of the electric vehicle via the HMI.

The control system 100 further comprises a plurality of navigation sensors 114 that provide navigation data to the autonomous driving subsystem 112. For example, the navigation sensors 114 may include cameras, radar and Lidar sensors, a global positioning system (GPS), and so on. Based on the data received from the navigation sensors 114, the autonomous driving subsystem 112 controls a steering subsystem 116 and a braking subsystem 118 of the electric vehicle. The autonomous driving subsystem 112 also controls and manages the operation of the electric vehicle based on data regarding the health of the battery 104 received from the health monitoring system (e.g., from the controller 102 or the BMS 106).

The control system 100 further comprises a communication subsystem 120 that can communicate with one or more servers 122 in a cloud via a distributed communications network 124. For example, the distributed communications network 124 may include a cellular network, a satellite-based communication network, a Wi-Fi network, the Internet, and so on. The communication subsystem 120 may include one or more transceivers for communicating with the distributed communications network 124. The controller 102 communicates with the one or more servers 122 in the cloud via the communication subsystem 120. The controller 102 communicates the data from the battery 104 processed by the health monitoring system (described below) to the one or more servers 122 via the communication subsystem 120. The controller 102 generates alerts based on the data from the battery 104 processed by the health monitoring system and provides the alerts to the occupants of the electric vehicle via the HMI of the infotainment subsystem 108. The controller 102 may also receive alerts from the one or more servers 122 based on the data from the battery 104 processed by the one or more servers 122 and provides the alerts to the occupants of the electric vehicle via the HMI of the infotainment subsystem 108.

Figure 2A:
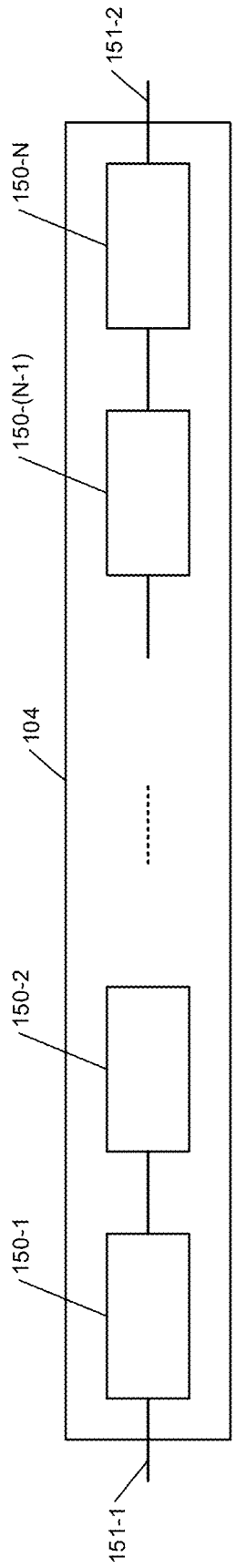
FIGS. 2A and 2B show an example of a battery of the electric vehicle comprising cell groups.
Figure 2B:
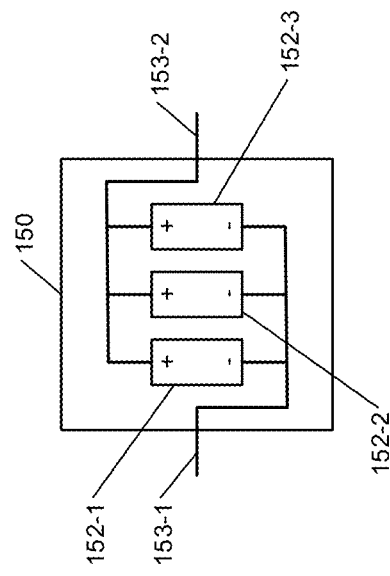

FIGS. 2A and 2B shows an example of the battery 104 comprising one or more battery packs. Hereinafter, the term battery and battery pack are used interchangeably. In general, the battery 104 may comprise a plurality of battery packs. Each battery pack may comprise a plurality of modules. Each module may comprise a plurality of cell groups. Each cell group may comprise a plurality of cells.

In FIG. 2A, the battery 104 comprises one or more battery packs each comprising a plurality of cell groups. For example, the battery 104 comprises cell group 1 150-1, cell group 2 150-2, ..., cell group 150-(N−1), and cell group N 150-N, where N is a positive integer (collectively the cell groups 150). The cell groups 150 are connected to each other in series. For each battery pack comprising the cell groups 150, a pack level current I through the cell groups 150 of the battery pack is measured by measuring current through terminals 151-1, 151-2 (collectively the terminals 151) of the battery pack comprising the cell groups 150. The current measurement is described below with reference to FIG. 5.

In FIG. 2B, each cell group 150 comprises a plurality of cells (e.g., 3 cells). For example, each cell group 150 comprises cells 152-1, 152-2, and 152-3 (collectively the cells 152). While only 3 cells are shown for example only, each cell group 150 may include fewer or more than three cells 152. The cells 152 in each cell group 150 are connected to each other in parallel, in series, or using a combination of series and parallel connections. Voltages across each individual cell group 150 are measured across terminals 153-1, 153-2 (collectively the terminals 153) of each cell group 150. The voltage measurements are described below with reference to FIG. 5.

Accordingly, for each battery pack comprising the N cell groups 150, the pack level current I (also called the battery current I throughout the present disclosure) and N voltages across the N cell groups 150 are measured. These current and voltage measurements allow calculation of internal resistances of each individual cell group 150. The internal resistance of the battery 104 can be used as a health indicator to indicate the health of the battery 104.

The health monitoring system, which is described below in detail with reference to FIG. 5, generates the health indicator by taking into account various factors that impact the internal resistance of the battery 104. For example, the factors include but are not limited to temperature, state of charge (SOC), and current of the battery 104. The health monitoring system can identify and isolate one or more cell groups 150 that are faulty and that contribute the most to the performance degradation of the battery 104. To identify and isolate one or more cell groups 150 that are faulty, the health monitoring system can process the pack level current and the voltages of individual cell groups 150 in the onboard controller (e.g., the controller 102), in the cloud (e.g., in the one or more servers 122), or using a combination of both. The health monitoring system can provide the health indication of the battery 104 in the form of proactive alerts to an occupant of the electric vehicle and to service technicians for prognostics and diagnostics purposes as described below in detail.

Figure 3A:
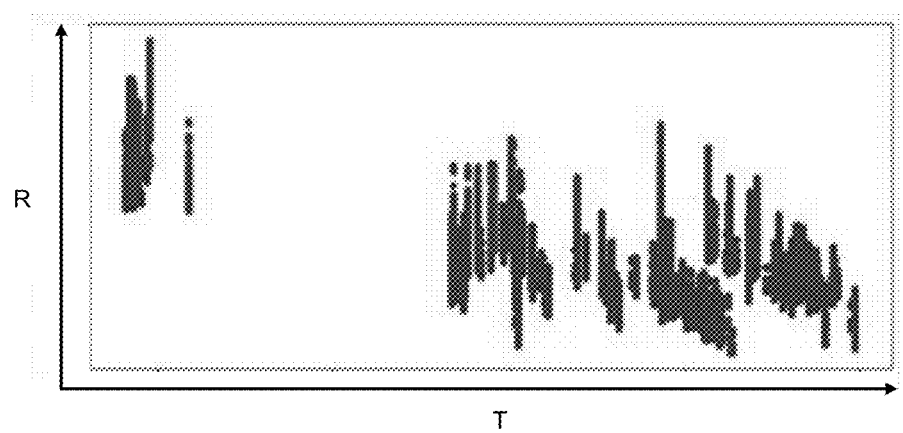
FIGS. 3A-3C show examples of factors affecting an internal resistance of the battery.
Figure 3B:
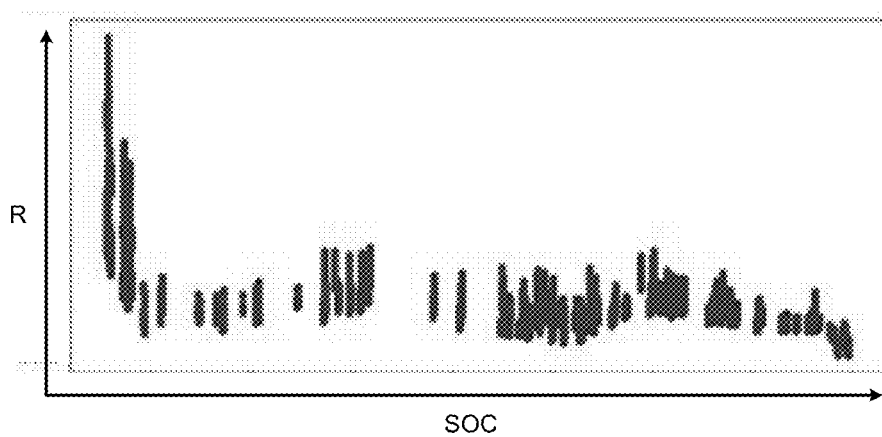
Figure 3C:
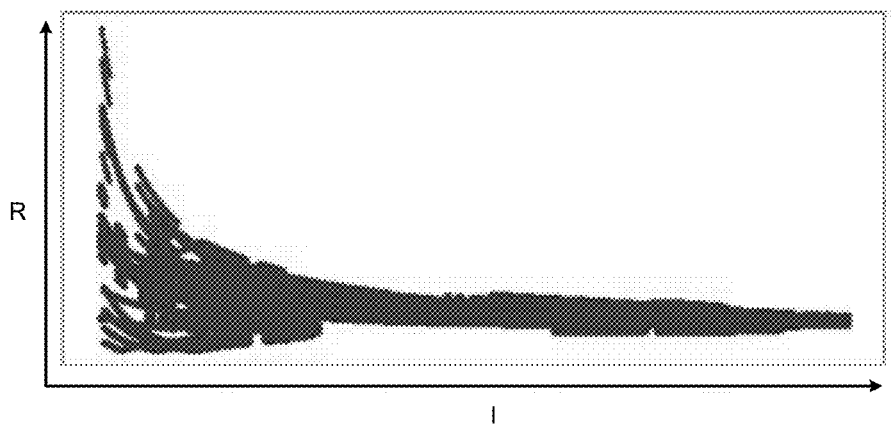

FIGS. 3A-3C show how the internal resistance of the battery 104 is impacted by various factors such as temperature, SOC, and current of the battery 104. For example, in FIG. 3A, if the current I and SOC of the battery 104 are within a narrow range, the internal resistance R of the battery 104 is higher at lower temperatures T of the battery 104 and lower at higher temperatures T of the battery 104. In FIG. 3B, if the temperature T and current I of the battery 104 are within a narrow range, the internal resistance R of the battery 104 is higher when SOC of the battery 104 is lower and lower when SOC of the battery 104 is higher. In FIG. 3C, if the temperature T and SOC of the battery 104 are within a narrow range, the internal resistance R of the battery 104 is lower when the current I of the battery 104 is higher (supposing the current I is a discharge current) and lower when the current I of the battery 104 is higher.

Accordingly, the internal resistance of the battery 104 varies differently depending on the temperature, SOC, and current of the battery 104. Consequently, the internal resistance data of the battery 104, when measured over the entire current profile of the battery 104, which includes various vehicle speeds, are not comparable due to the different operating conditions of the battery 104 over the entire current profile of the battery 104. Therefore, the health monitoring system divides the current profile of the battery 104 into narrow operating regions and measures the current of the battery 104 and the voltages of the cell groups 150 in each operating region to smooth out the effects of the operating conditions as described below.

Figure 4:
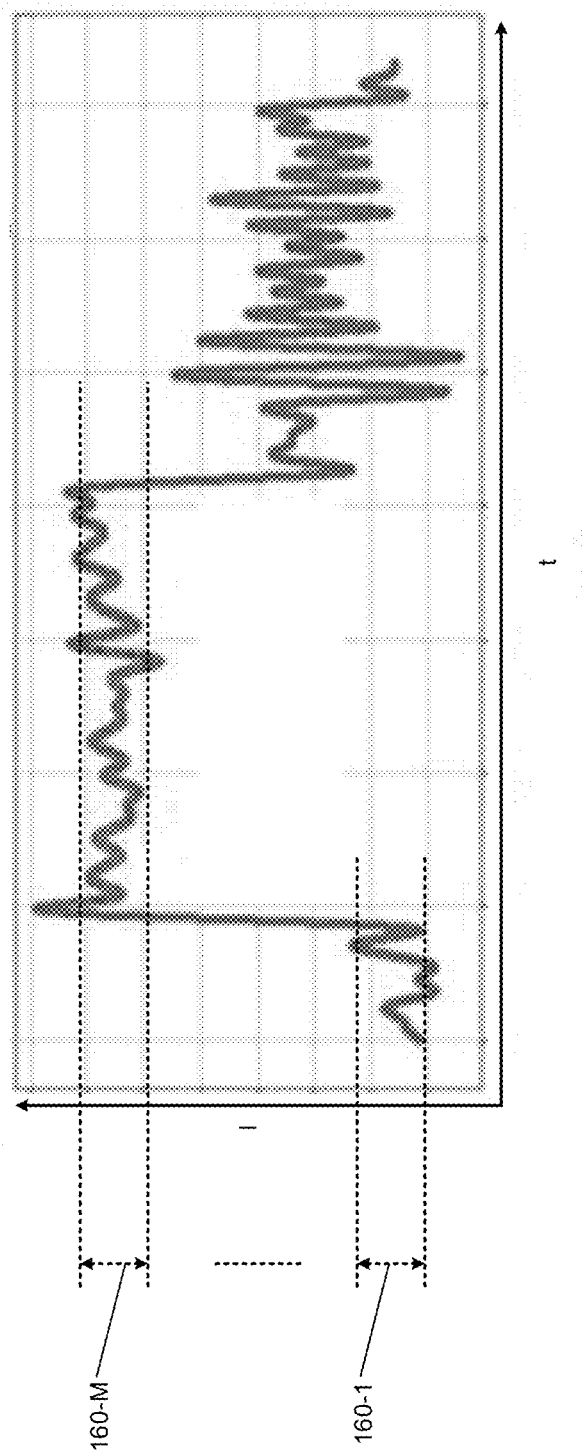
FIG. 4 shows an example of a current profile of the battery during a drive cycle of the electric vehicle.

FIG. 4 shows an example of a current profile of the battery 104 in a drive cycle. For example, the drive cycle is a trip made by the vehicle. For example, suppose that in a trip, the vehicle initially moves at a slower speed (e.g., on a surface street), then moves at a relatively constant speed (e.g., on a highway), then again moves at varying lower and higher speeds (e.g., on surface streets). The current profile of the battery 104 during the trip varies depending on the speed of the vehicle. For example, the current may be lower at slower speeds of the vehicle and higher at higher speeds of the vehicle.

Since the current and the operating conditions of the battery 104 vary during the trip, the entire current profile of the battery 104 is not selected for the current and voltage measurements. Instead, a plurality of operating regions 160-1, . . . , and 160-M, where M is a positive integer (collectively the operating regions 160) of the current profile of the battery 104 over the drive cycle are selected. The procedure for defining the operating regions 160 is described below in further detail with reference to FIGS. 6 and 7.

Briefly, each operating region 160 is a function of the current I, SOC, and temperature T of the battery 104. Each operating region 160 is selected where the current is relatively stable (i.e., is within a narrow range) at time t for a selected SOC and temperature T of the battery 104 as explained below in detail with reference to FIG. 8. The selected SOC and temperature T of the battery 104 can be calibrated parameters. For example, theses parameters can be set when the vehicle is manufactured and can be altered via updates provided to the vehicle during the life of the vehicle.

Figure 5:
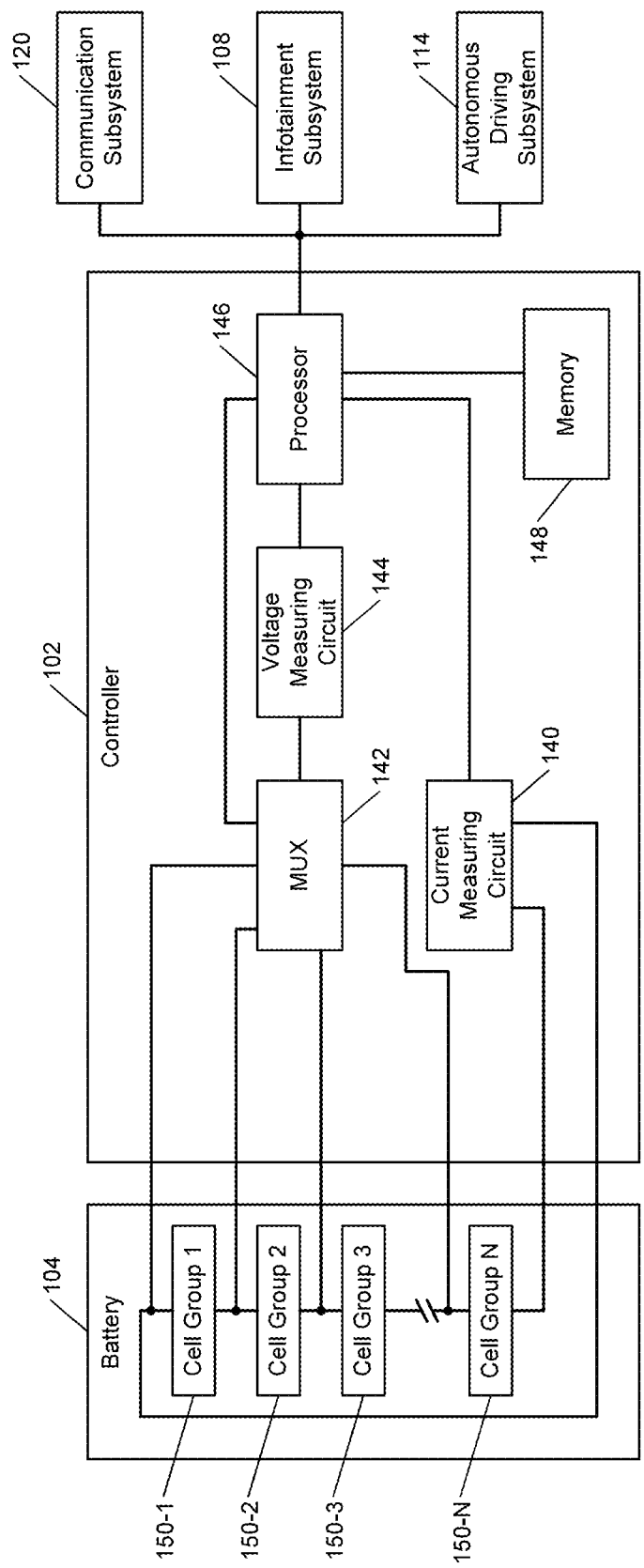
FIG. 5 shows an example of a health monitoring system for the battery.
Figure 6:
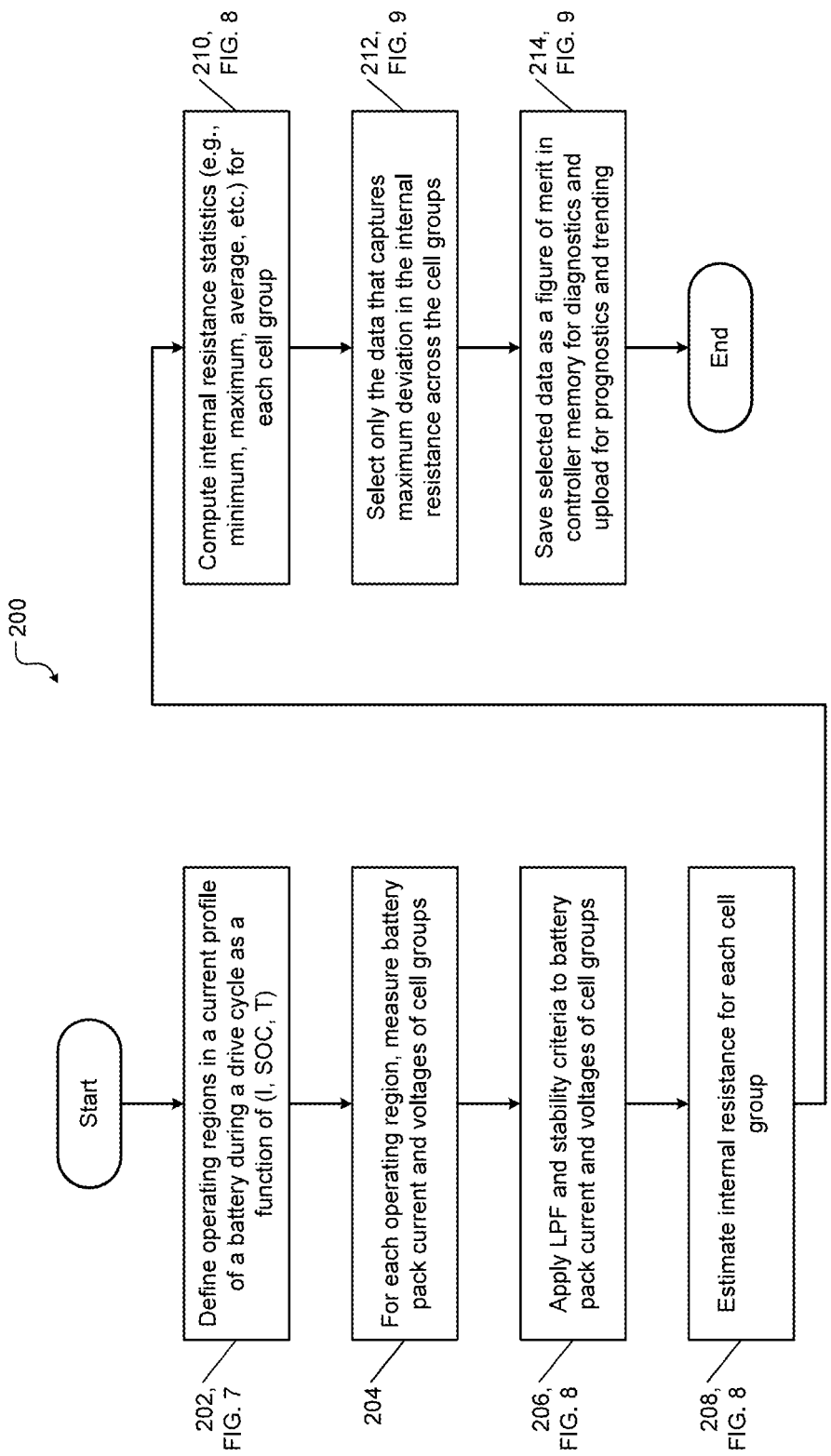
FIG. 6 shows a method for monitoring and assessing the health of the battery.

FIG. 5 shows an example of the health monitoring system implemented in the controller 102. The health monitoring system comprises a current measuring circuit 140, a multiplexer 142, a voltage measuring circuit 144, a processor 146, and memory 148. The current measuring circuit measures the current I through the N cell groups 150. The multiplexer 142 connects the voltage measuring circuit 144 across each of the cells groups 150. The processor 146 controls the multiplexer 142. The voltage measuring circuit 144 measures the voltages across each of the cells groups 150. The processor 146 processes the current and voltage measurements and stores only selected processed data in the memory 148 as described below with reference to FIGS. 6-9. Due to the selective storage of processed data, the size (i.e., amount) and usage of the memory 148 are optimized.

Figure 7:
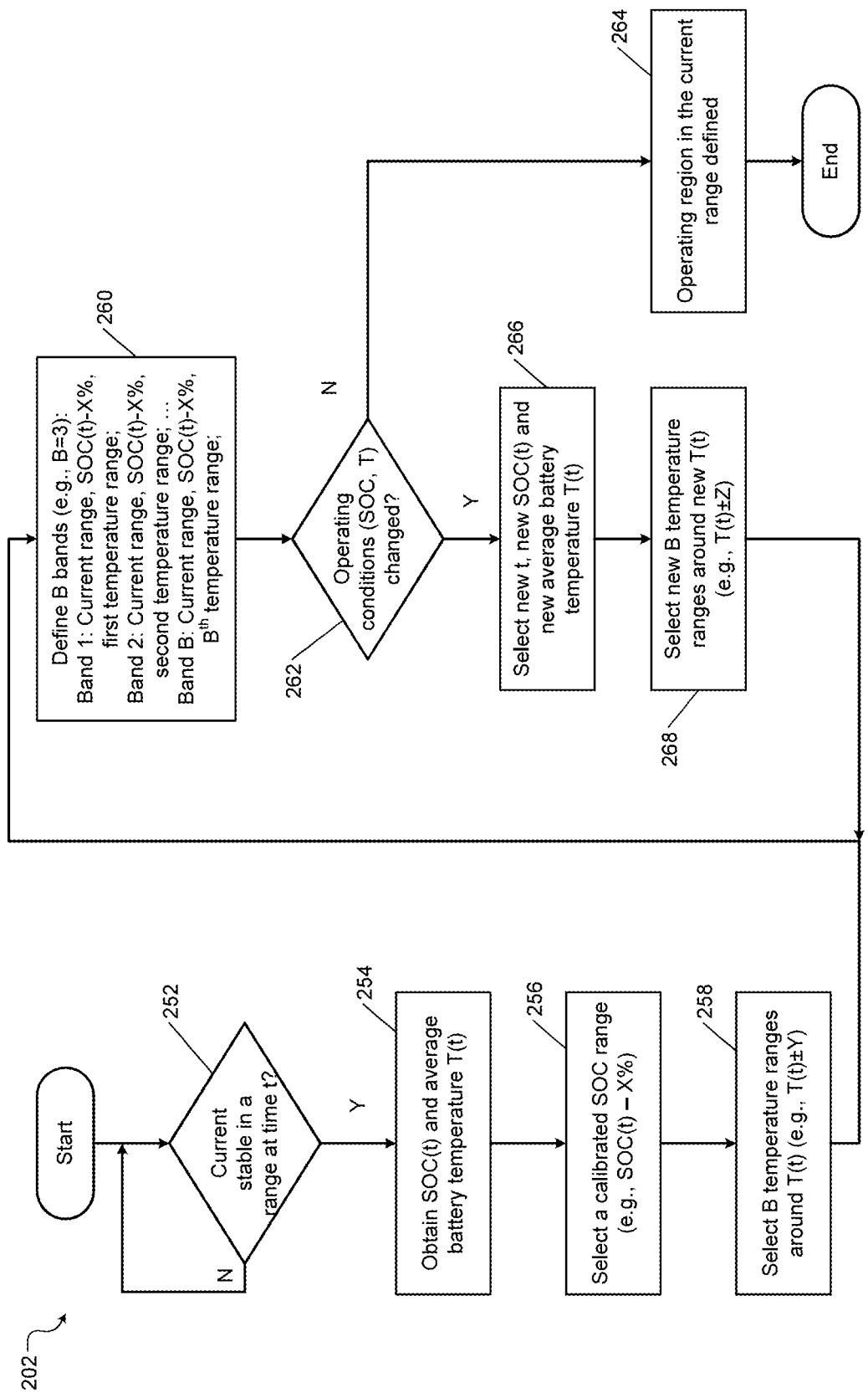
FIGS. 7-9 show the method of FIG. 6 in further detail.
Figure 8:
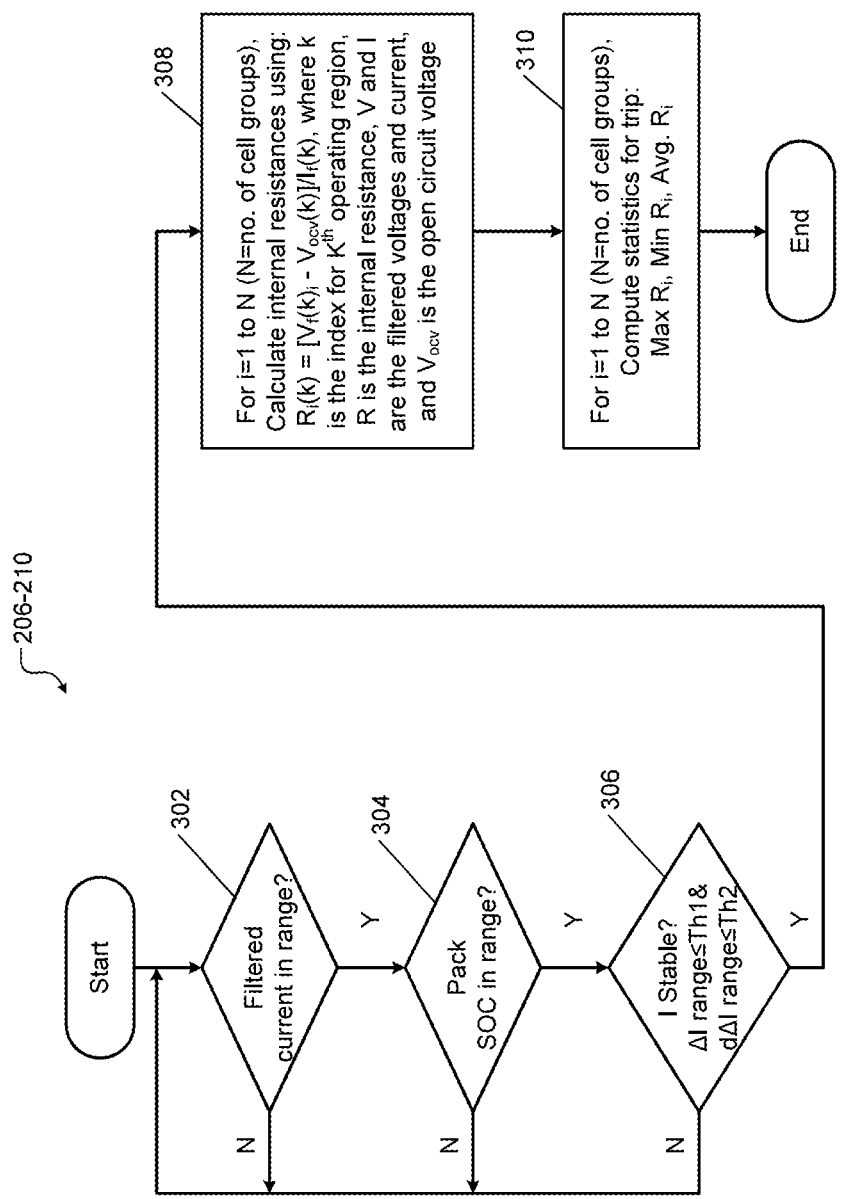
Figure 9:
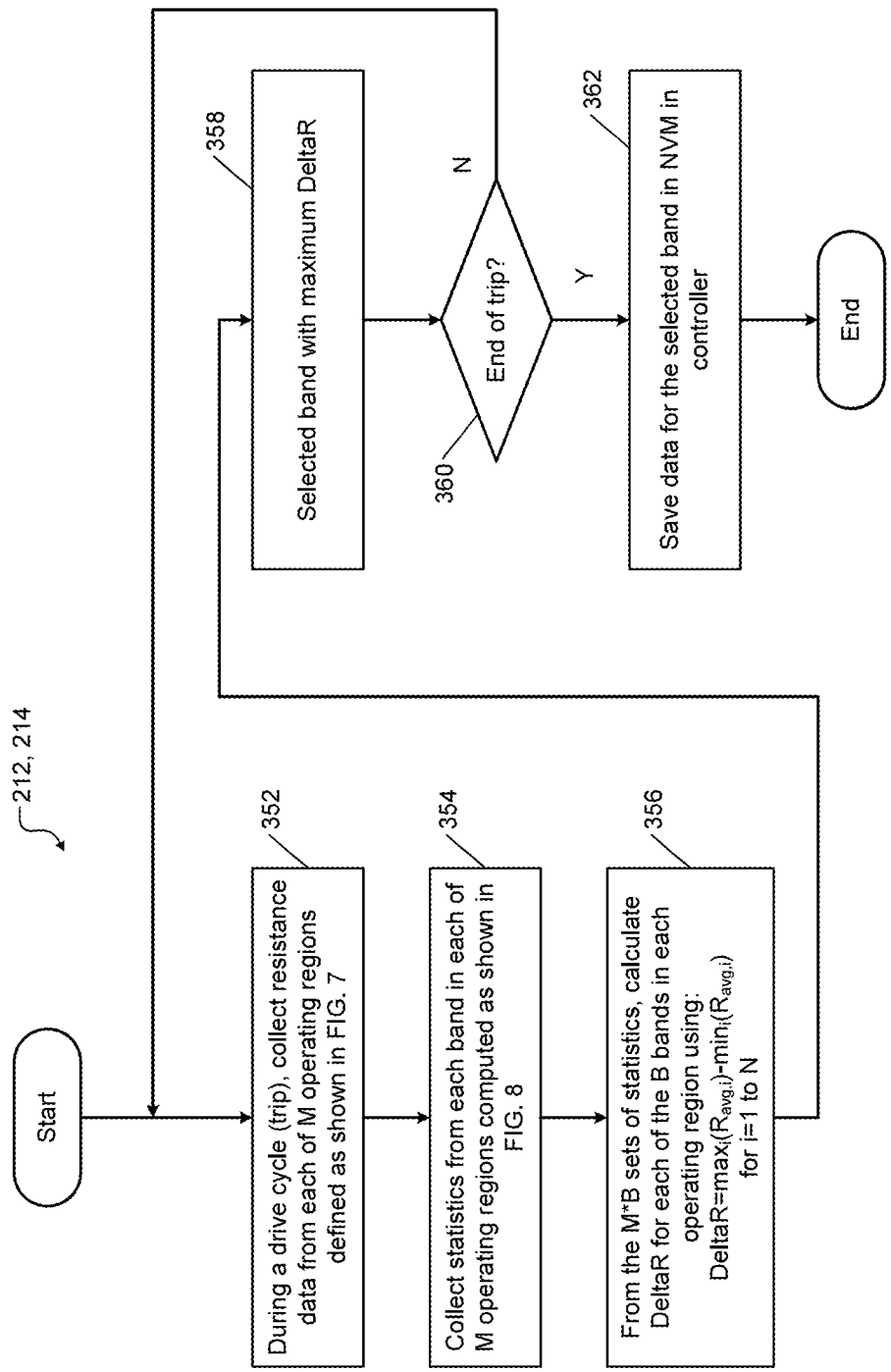

FIG. 6 shows a method 200 for generating a health indicator based on internal resistances of the cell groups 150 in multiple operating regions 160 according to the present disclosure. FIGS. 7-9 show some of the steps of the method 200 in further detail. The method 200 is performed by the health monitoring system of FIG. 5. For example, the processor 146 along with the other circuits of the controller 200 may perform the method 200.

In FIG. 6, at 202, the method 200 defines the operating regions 160 in the current profile of the battery 104 during a drive cycle of the vehicle as a function of the current I, SOC, and temperature T of the battery 104. Defining the operating regions 160 is described in further detail with reference to FIG. 7. At 204, for each operating region 160, the method 200 measures the current I through the battery pack (i.e., through the N cell groups 150) and voltages across each cell group 150 as explained above with reference to FIG. 5.

At 206, the method 200 uses a low pass filter to filter the measured current I through the battery pack and the voltages measured across each cell group 150. The low pass filtering is performed to minimize high frequency noise in the current and voltage measurements and to reduce the impact of diffusion and charge transfer phenomena that occur in the battery 104. For example, the diffusion and charge transfer phenomena can be approximated as respective resistance-capacitance (RC) pairs. The low pass filtering reduces the effects of these capacitances at lower frequencies so that the internal resistances of the cell groups 150 can be accurately measured. In addition, the method 200 uses stability criteria to estimate the internal resistances when the current I is stable. The stability criteria are described in further detail with reference to FIG. 8.

At 208, for each cell group, the method 200 estimates the internal resistances of the cell groups 150 based on the filtered current I and the filtered voltages of the cell groups 150 measured in each operating region 160. At 210, the method computes internal resistance statistics (e.g., minimum, maximum, average, and other values of the internal resistances) estimated for each cell group 150 in each operating region 160. While minimum, maximum, average values are used throughout the present disclosure for example only, the statistics can also include other statistical data including but not limited to standard deviation, variance, and so on. The statistics are also called summary statistics. The estimation of the internal resistances and the computation of the statistics are described in further detail with reference to FIG. 8.

At 212, the method 200 selects only the optimal data that captures or indicates maximum deviation in the internal resistance across the cell groups 150. Selecting the optimal data ensures that only the data from the cell group or cell groups 150 that is/are maximally contributing to the increase in the internal resistance of the battery 204 is considered, and any outliers that are only marginally contributing to the increase in the internal resistance of the battery 204 are not considered. The selection criteria are described in further detail with reference to FIG. 9.

At 214, the method 200 saves only the selected data as a figure of merit in the memory 148 of the controller 102 for diagnostic monitoring (e.g., by a service technician and/or to send a message about the health of the battery to the infotainment subsystem 108). The method 200 can also upload the selected data to the one or more servers 122 in the cloud for performing prognostics and trending of the health of the battery 104. Saving only the selected data optimizes the size and use of the memory 148.

FIG. 7 shows a procedure for defining the operating regions 160 in the current profile of the battery 104 during a drive cycle of the vehicle as a function of the current I, SOC, and temperature T of the battery 104 (i.e., step 202 of the method 200 shown in FIG. 6) in further detail. In the following description of FIG. 7, step 202 of the method 200 is simply referred to as method 202. At 252, the method 202 determines if the current I is stable in a selected narrow range at time t. The method 202 waits until the current I is stable in the selected narrow range. The stability criteria used to determine whether the current I is stable are described below with reference to FIG. 8.

If the current I is stable in the selected narrow range at time t, at 254, the method 202 obtains the SOC of the battery 104 at time t as SOC(t) and the average temperature of the battery 104 at time t as T(t). At 256, the method 202 selects a calibrated SOC range (e.g., SOC(t)-X %, where X is a positive integer). At 258, the method 202 selects B temperature ranges around T(t) (e.g., T(t)±Y, where Y is an integer), where B is a positive integer.

At 260, the method 202 defines B bands (e.g., B=3) in each operating regions 160 as follows. A first band, Band 1: The selected narrow current range for the current I, SOC(t)-X %, and a first temperature range (e.g., by selecting a first value of Y); a second band, Band 2: The selected narrow current range for the current I, which is the same for Band 1, SOC(t)-X %, which also the same for Band 1, and a second temperature range (e.g., by selecting a second value of Y); and a third band, Band 3: The selected narrow current range for the current I, which is the same for Band 1, SOC(t)-X %, which also the same for Band 1, and a third temperature range (e.g., by selecting a third value of Y).

Note that the SOC and the temperature can vary during the drive cycle. While all three bands can have different temperature ranges, two of the three bands can have overlapping temperature ranges. Further, instead of keeping the SOC constant across the three bands and selecting different temperature ranges, the temperature can be kept constant across the three bands, and different SOC ranges can be selected for at least two of the three bands. Further, while B=3 is used throughout the present disclosure for simplicity of illustration only, the methodology similar to that described above can be extended to any number of bands. Furthermore, the number of bands can vary across different operating regions 160. The bands can also be considered and called sub-regions of the operating regions 160.

At 262, the method 202 determines if the operating conditions (i.e., SOC and temperature T) of the battery 104 have changed. If the operating conditions have not changed, at 264, the method 202 defines the selected narrow current range as the operating region 160 in the current profile of the battery 104. However, since the battery 104 discharges as the vehicle is driven, the SOC of the battery 104 can change more than SOC(t)-X %. Alternatively or additionally, the average temperature T of the battery 104 can change more than T(t)±Y. If the operating conditions (i.e., SOC and/or temperature T) of the battery 104 have changed, the method 202 reconstructs new B bands as follows.

At 266, the method 202 selects a new time t, a new SOC(t), and a new T(t) for the selected narrow range of the current I. At 268, the method 202 selects new B temperature ranges around the new T(t) (e.g., T(t)±Z, where Z is an integer), and the method 202 repeats the steps 260 and 262 until an operating region can be defined. Subsequently, the method 202 returns to estimate the internal resistances for the cell groups 150 in the defined operating region 160 (i.e., in the selected narrow range of the current I) and computes the summary statistics for the cell groups 150 in the defined operating region 160 as described above with reference to FIG. 6.

FIG. 8 shows steps 206-210 of the method 200 shown in FIG. 6 in further detail. The following procedure is performed for the cell groups 150 in each operating region 160. After filtering the current I and the voltages measured across the cell groups 150 in an operating region 160, the method 200 applies the stability criteria and estimates the internal resistances of the cell groups 150 as follows.

At 302, the method 200 determines if the filtered current I is within a predetermined range (e.g., the selected narrow range described above with reference to FIG. 7). The method 200 waits if the filtered current I is not within the predetermined range. If the filtered current I is within the predetermined range, at 304, the method 200 determines if the SOC of the battery 104 is within a predetermined range. The method 200 waits if the SOC is not within the predetermined range.

If both the filtered current I and the SOC are with their respective predetermined ranges, at 306, the method 200 determines if the filtered current I is stable. For example, the method 200 determines that the filtered current I is stable if first and second derivatives of the filtered current are within respective predetermined ranges for a predetermined time period. The method 200 waits if the filtered current I is stable. If both the filtered current I is stable and the SOC is within the predetermined range, at 308, the method 200 calculates the internal resistances of the cell groups 150 in the operating region 160 as follows.

For i=1 to N (N=no. of cell groups 150), the method 200 calculates the internal resistances using the following equation: $R_i(k)=[V_f(k)_i-V_{ocv}(k)]/I_f(k)$, where k is the index for $K^{th}$ operating region 160, $R_i$ is the internal resistance of the $i^{th}$ cell group 150, V and I are respectively the filtered voltage of the $i^{th}$ cell group 150 and the filtered current I of the battery 104, and Vocv is the open circuit voltage of the battery 104 obtained from a pre-calibrated SOC-to-OCV curve for the battery 104.

At 310, the method 200 computes the summary statistics for each of the cell groups 150 in the operating region 160. For example, the summary statistics include Max $R_i$, Min $R_i$, Avg. $R_i$ for i=1 to N (N=no. of cell groups 150). The summary statistics are calculated for all the cell groups 150 for each operating region 160 during a drive cycle (i.e., a trip).

FIG. 9 shows a procedure for selecting optimal data from the summary statistics (i.e., steps 212 and 214 of the method 200 shown in FIG. 6) in further detail. Over a drive cycle (i.e., a trip), the vehicle may operate in different operating regions 160 at different times. When the vehicle is in an operating region 160, the current I and the voltages across the cell groups 150 are measured in the operating region 160, and B sets of statistics are computed for the operating region 160. Accordingly, for M operating regions 160, with B bands per operating region 160, the total number of statistics for a trip will be M*B. At the end of the trip only optimal data from these statistics is selected and saved in the memory 148 of the controller 102.

If the battery 104 is healthy (i.e., operating normally with none of the cell groups 150 exhibiting abnormal internal resistances), all of the cell groups 150 will have internal resistances within a narrow range. If the internal resistance of one of the cell groups 150 is deviating from the narrow range, the deviation causes a resistance spread across all of the statistics collected throughout the drive cycle. The resistance spread can be used as a metric to determine which data is optimal that can be further evaluated to isolate an anomalous (i.e., faulty) cell group 150 in the battery 104. The optimal data from these statistics is selected as follows.

At 352, during a drive cycle (i.e., trip), the method 200 collects the internal resistance data for the cell groups 150 for each of the M operating regions 160 (defined as shown in FIG. 7). At 354, the method 200 collects the statistics computed for all the cell groups 150 in each band in each of the M operating regions 160 (as described above with reference to FIG. 8).

At 356, from these M*B statistics, for each band, the method 200 calculates a difference between the maximum and minimum average internal resistances of all the N cell groups 150. The difference between the maximum and minimum average internal resistances of the cell groups 150 is called DeltaR. The method 200 calculates DeltaR using the following equation: $DeltaR=max_i(R_{avg,i})-min_i(R_{avg,i})$ for i=1 to N. The method 200 calculates DeltaR for each of the B bands in each of the operating regions 160 over the drive cycle of the vehicle.

Specifically, in each band, the method 200 computes DeltaR as a difference between the maximum average internal resistance and the minimum average internal resistance of all the cell groups 150. Based on $R_{avg}$ of all the cell groups 150, the method 200 calculates deltaR with maximum and minimum $R_{avg}$ of all the cell groups 150. This computation is done for all of the operating regions 160. Accordingly, for B=3, the method 200 calculates DeltaR1, DeltaR2, and DeltaR3 for each of the operating regions 160.

At 358, the method 200 selects an optimal band with maximum DeltaR from M*B bands. The band with maximum DeltaR is the band with maximum difference in R across the cell groups 150. At 360, the method 200 determines if the drive cycle (i.e., trip) is complete. The method 200 returns to 352 if the drive cycle is not complete. If the drive cycle is complete, the method 200 saves the internal resistance data from the selected band in the memory 148 of the controller 102 at the end of the trip (e.g., when the vehicle is turned off).

The data saved in the memory 148 can be used for diagnostics by a service technician and/or for providing an alert to the infotainment subsystem 108. The method 200 can also provide a message about the health of the battery 104 to the infotainment subsystem 108 based on the data saved in the memory 148. The method 200 can also send the data from the selected band to the one or more servers 122 in the cloud for performing prognostics and trending of the health of the battery 104.

Selecting only the optimal data (i.e., the data from the selected band) is helpful since an anomaly in the internal resistance data due to a faulty cell group 150 may not be evident in all the operating regions 160. For example, suppose that a typical drive cycle or trip includes the vehicle starting from rest, driving on a surface street, driving on a highway, getting off the highway, driving on a surface street, and coming to rest. In such a drive cycle, the internal resistance of an anomalous cell group 150 may not be abnormal (i.e., may not exhibit higher internal resistance) during initial slow start. However, after the vehicle is driven on the highway, after the battery 104 is somewhat discharged, the internal resistance of the anomalous cell group 150 may exhibit abnormality (i.e., higher internal resistance value) during the later portion of the slow driving on the surface street after getting off the highway. Accordingly, the data collected from the cell groups 150 during the initial portion of the trip is not useful for detecting the anomalous cell group 150 whereas the data collected from the cell groups 150 during the later portion of the trip is useful for detecting the anomalous cell group, although the data in both portions may be collected in the same operating region(s) 160 (i.e., lower current range(s)).

In general, only a few cell groups 150 may exhibit abnormally high internal resistance and contribute more than other cell groups 150 to the deviation in the internal resistance of the battery 104. Therefore, to isolate only the cell group(s) 150 that contribute(s) most to the deviation in the internal resistance of the battery 104, the above procedure shown and described with reference to FIG. 9 is used to select the optimal internal resistance data from the cell groups 150.

Figure 10A:
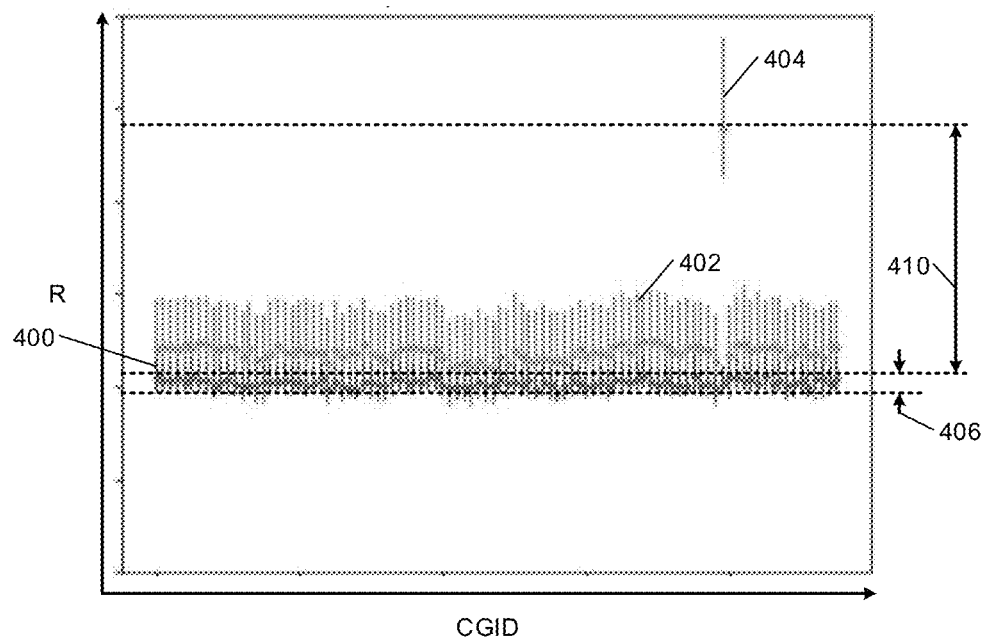
FIGS. 10A and 10B show graphs illustrating spreads in internal resistances of the cell groups of the battery.
Figure 10B:
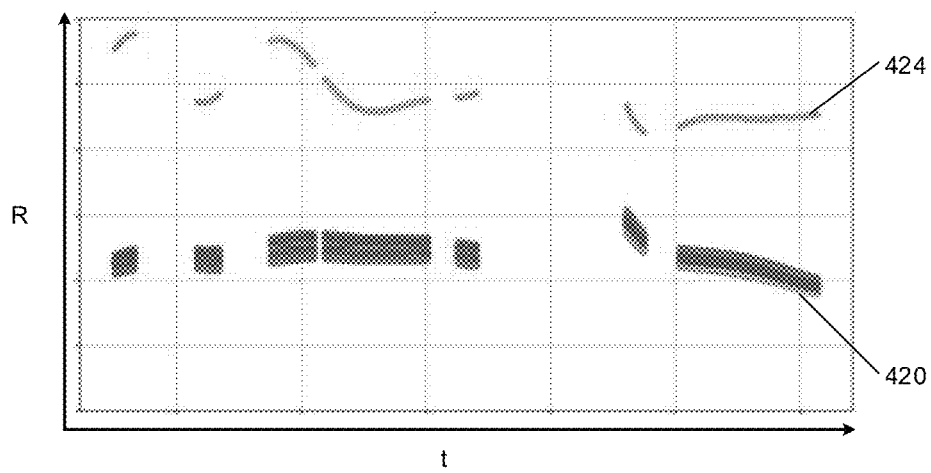

FIGS. 10A and 10B show examples of the spread in the internal resistance data across the cell groups 150. FIG. 10A shows a graph of the internal resistance R versus cell group ID. The internal resistance data when the cell groups 150 are healthy is shown at 400. The internal resistance data when the cell groups 150 begin to degenerate is shown at 402. The internal resistance data of a cell group that is faulty (i.e., with the maximum internal resistance spread) is shown at 404. The dots represent average values of the internal resistance R. The DeltaR (i.e., the difference or spread between the maximum and minimum average values of the internal resistance R for all the cell groups 150) when the cell groups 150 are healthy is shown at 406. The DeltaR for the cell group 150 that is faulty is shown at 410.

FIG. 10B shows a graph of the internal resistance R versus time. The data when the cell groups 150 are healthy is shown at 420. The data of a cell group 150 that is faulty is shown at 424.

The final data (i.e., the optimal data selected as described above with reference to FIG. 9) that is saved in the memory 148 of the controller 102 and that is used for assessing the health of the battery 104 are the statistics computed within the selected band. The final data includes the maximum, minimum, and average (and other) values of the internal resistances for all the cell groups 150 in the selected band. In addition, the modules in the battery 104 comprising the cell groups 150 include a respective temperature sensor that provides an average module temperature. The average module temperatures and SOC of the battery 104 at the maximum and minimum internal resistances for each cell group 150 are also used for assessing and tracking the health of the battery 104 over time.

The final data saved in the memory 148 of the controller 102 as figures of merit provides the most recent maximum internal resistance spread across the cell groups 150 of the battery 104, the most recent internal resistance of the battery 104, and so on. In some implementations, final data from most recent Q trips (where Q is a positive integer) may be saved on a last-in first-out (LIFO) basis to provide a history of the health of the battery 104. Such historical data can provide a history of the most recent Q internal resistances of each cell group 150 by applying maximum deltaR criteria for each of the Q trips.

The system and method of the present disclosure improves the battery technology. Specifically, the system and method provide an internal resistance estimator that is robust since the estimation using different operating regions accounts for noise and varying operating conditions of the battery and reliably detects faults in the battery. The estimator optimizes the controller memory by storing only optimal health indicator data in the controller memory. The system and method passively identify faults in battery packs and individual cell groups in the battery while the vehicle is being driven without impacting driving. Further, the system and method identify faulty battery packs and cell groups in the battery proactively; that is, before a fault occurs and the vehicle stalls stranding the occupant. The system and method provide early fault indication and prognosis capability for predicting battery performance degradation while managing vehicle operation. The system and method monitor progressive trends in battery health and provide early warning (proactive alerts) to users ahead of a battery failure.

The foregoing description is merely illustrative in nature and is not intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A system for monitoring a battery of a vehicle, the system comprising:
    a current measuring circuit configured to measure a current of the battery comprising a plurality of cell groups connected to each other;
    a voltage measuring circuit configured to measure voltages of the cell groups; and
    a controller in communication with current and voltage measuring circuits and configured to:
        define a plurality of operating regions in a current profile of the battery during a drive cycle of the vehicle based on predetermined ranges of the current, temperature, and state of charge of the battery;
        filter the current and the voltages measured in the plurality of operating regions;
        calculate internal resistances of the cell groups in the plurality of operating regions based on the filtered current and voltages;
        generate statistical values based on the internal resistances of the cell groups; and
        determine whether one or more of the cell groups is faulty based on differences between maximum and minimum values of one or more of the statistical values across the cell groups;
    wherein the controller is configured to:
    define a plurality of bands within one of the plurality of operating regions based on a predetermined range of the current and a plurality of predetermined ranges of temperature and state of charge of the battery, wherein the predetermined range of the current and one of the plurality of predetermined ranges of (i) temperature and (ii) state of charge of the battery is constant for all of the plurality of bands;
    calculate the internal resistances of the cell groups in the bands based on the filtered current and the voltages;
    generate individual statistical values for the bands based on the internal resistances of the cell groups in the bands;
    determine differences between maximum and minimum values of one or more of the individual statistical values;
    select internal resistance data of the cell groups from one of the bands corresponding to a highest value of the differences; and
    diagnose a health of the battery based on the selected internal resistance data.

2. The system of claim 1 wherein the controller is configured to determine whether the one or more of the cell groups is faulty based on a highest value of the differences.

3. The system of claim 1 wherein the controller is configured to select internal resistance data of the cell groups from one of the plurality of operating regions corresponding to a highest value of the differences and further configured to at least one of:
    store the selected internal resistance data in memory of the controller for diagnosing the one or more of the cell groups;
    send the selected internal resistance data to a remote server for prognostics and determining a trend in a health of the battery; and
    provide a message regarding the health of the battery based on the selected internal resistance data.

4. The system of claim 1 wherein the controller is configured to define one of the plurality of operating regions when the current is stable for a predetermined time period in the one of the plurality of operating regions.

5. The system of claim 1 wherein the controller is configured to define the plurality of operating regions based on the current, temperature, and state of charge of the battery.

6. The system of claim 1 wherein the controller is configured to determine whether the one or more of the cell groups is faulty regardless of changes in temperature and state of charge of the battery.

7. The system of claim 1 wherein the controller is configured to at least one of:

store the selected internal resistance data in memory of the controller for diagnosing the one or more cell groups;

send the selected internal resistance data to a remote server for prognostics and determining a trend in the health of the battery; and provide a message regarding the health of the battery based on the selected internal resistance data.

8. A method for monitoring a battery of a vehicle, the method comprising:

measuring a current of the battery comprising a plurality of cell groups connected to each other and voltages of the cell groups;

defining a plurality of operating regions in a current profile of the battery during a drive cycle of the vehicle based on predetermined ranges of the current, temperature, and state of charge of the battery;

filtering the current and the voltages measured in the plurality of operating regions;

calculating internal resistances of the cell groups in the plurality of operating regions based on the filtered current and voltages;

generating statistical values based on the internal resistances of the cell groups;

determining whether one or more of the cell groups is faulty based on differences between maximum and minimum values of one or more of the statistical values across the cell groups;

defining a plurality of bands within one of the plurality of operating regions based on a predetermined range of the current and a plurality of predetermined ranges of temperature and state of charge of the battery, wherein the predetermined range of the current and one of the plurality of predetermined ranges of (i) temperature and (ii) state of charge of the battery is constant for all of the plurality of bands;

calculating the internal resistances of the cell groups in the bands based on the filtered current and the voltages;

generating individual statistical values for the bands based on the internal resistances of the cell groups in the bands;

determining differences between maximum and minimum values of one or more of the individual statistical values;

selecting internal resistance data of the cell groups from one of the bands corresponding to a highest value of the differences; and diagnosing a health of the battery based on the selected internal resistance data.

9. The method of claim 8 further comprising determining whether the one or more of the cell groups is faulty based on a highest value of the differences.

10. The method of claim 8 further comprising:

selecting internal resistance data of the cell groups from one of the plurality of operating regions corresponding to a highest value of the differences; and storing the selected internal resistance data in memory of a controller coupled to the battery for diagnosing the one or more of the cell groups; or sending the selected internal resistance data to a remote server for prognostics and determining a trend in a health of the battery; or providing a message regarding the health of the battery based on the selected internal resistance data.

11. The method of claim 8 further comprising defining one of the plurality of operating regions when the current is stable for a predetermined time period in the one of the plurality of operating regions.

12. The method of claim 8 further comprising defining the plurality of operating regions based on the current, temperature, and state of charge of the battery.

13. The method of claim 8 further comprising determining whether the one or more of the cell groups is faulty regardless of changes in temperature and state of charge of the battery.

14. The method of claim 8 further comprising at least one of:

storing the selected internal resistance data in memory of a controller coupled to the battery for diagnosing the one or more cell groups; or sending the selected internal resistance data to a remote server for prognostics and determining a trend in the health of the battery; or providing a message regarding the health of the battery based on the selected internal resistance data.

* * * * *